United States Patent
Ariga et al.

(10) Patent No.: US 7,144,258 B2
(45) Date of Patent: Dec. 5, 2006

(54) FIXING MEMBER

(75) Inventors: Kohji Ariga, Kariya (JP); Yutaka Iguchi, Aichi-ken (JP); Hisayasu Mase, Nisshin (JP)

(73) Assignee: Aisin Seiki Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 10/946,131

(22) Filed: Sep. 22, 2004

(65) Prior Publication Data

US 2006/0063401 A1    Mar. 23, 2006

(30) Foreign Application Priority Data

Sep. 22, 2003    (JP)    ............................. 2003-330183

(51) Int. Cl.
*H01R 12/00*    (2006.01)
(52) U.S. Cl. ........................ 439/76.1; 439/79
(58) Field of Classification Search .............. 439/76.1, 439/79, 80; 361/736, 737
See application file for complete search history.

(56) References Cited

U.S. PATENT DOCUMENTS

| | | | |
|---|---|---|---|
| 5,712,766 A * | 1/1998 | Feldman | 361/737 |
| 6,365,832 B1 * | 4/2002 | Staron et al. | 174/52.1 |
| 6,537,084 B1 * | 3/2003 | Casey et al. | 439/76.1 |
| 6,728,111 B1 * | 4/2004 | Ku | 361/752 |
| 6,887,108 B1 * | 5/2005 | Wu | 439/638 |

FOREIGN PATENT DOCUMENTS

| | | |
|---|---|---|
| JP | 6-62486 | 9/1994 |
| JP | 2001-68910 | 3/2001 |

* cited by examiner

*Primary Examiner*—Briggette Hammond
*Assistant Examiner*—X. Chung-Trans
(74) *Attorney, Agent, or Firm*—Finnegan, Henderson, Farabow, Garrett & Dunner, LLP

(57) ABSTRACT

A fixing member includes a case member provided with at least a substrate supporting member adjusted to support a substrate and integrally provided with a connector, a cap member adjusted to be fixed to the case member, at least an external force transmitting portion extending at the substrate supporting member between the substrate supporting member and the cap member and adjusted to transmit an external force subjected to the connector to the cap member while the case member has been fixed at the cap member.

16 Claims, 3 Drawing Sheets

FIXING MEMBER

CROSS REFERENCE TO RELATED APPLICATIONS

This application is based on and claims priority under 35 U.S.C. § 119 with respect to Japanese Patent Application 2003-330183, filed on Sep. 22, 2003, the entire content of which is incorporated herein by reference.

FIELD OF THE INVENTION

This invention generally relates to a fixing member including a connector connected to a substrate.

BACKGROUND

Conventionally, various methods of fixing a connector to a substrate have been suggested, such as a method of fastening the connector at the substrate by a fastening cramp such as a screw, a method of soldering a connector terminal inserted into a bore of the substrate, and the like. As a further example, JP2001-68910A2 (hereinafter, referred to as a first reference) discloses a structure for fixing a connector at a substrate. The connector has a connector terminal of which tip portion projects outwardly from a connector housing. The tip portion of the connector terminal has an approximately L-shaped structure like a hook. This hook is inserted into a terminal bore at the substrate. A tip end of this hook is engaged at a substrate surface around the terminal bore so as to fix the connector at the substrate.

In this disclosed structure, the tip portion of the connector terminal has the hook such that the tip portion of the connector can be soldered at the substrate at a relatively easy manner. However, the soldering of the connector terminal at the substrate may deteriorate reliability of the substrate because the substrate may be cracked under a load due to a temperature cycle.

Recent developments have lead to a lead free solder in order to contribute to a clean environment. The lead free solder is generally molten at a relatively high melting point. Therefore, a connector may be transmitted with a heat upon the connector soldering through the screw such that a resin of the connector may be unnecessarily softened. In this case, the fastening force of the screw for fastening the connector at the substrate may be reduced. Further, the connector may not be appropriately fastened at the substrate.

As another example, JP 06(1994)-62486U2 (hereinafter, referred to as a second reference) discloses a structure for fixing a connector at a substrate by a solder. A fixing cramp for fixing the connector at the substrate has a two-forked leg portion at one end. The two-forked leg portion has projected portions at outer sides thereof. The projected portions are engaged at slit portions of the connector when the fixing cramp is guided into the connector. In this case, the connector can be fixed at the substrate by the fixing cramp without a solder. Therefore, not much worry is required in the reliability of the substrate and the fixing force.

According to the structure for fixing the connector at the substrate disclosed in the second reference, the connector can be easily connected to the substrate. However, when the connector is subjected to an external force upon detaching the connector and the substrate from a cap member, the external force may be drawn to the fixing cramp, the connector terminal, and a connecting portion between the fixing cramp and the connector terminal. In this case, the fixing cramp or the connector terminal may be damaged.

Further, the fixing cramp is separated from the connector, thereby increasing the number of components, increasing an assembling cost and hours.

A need exists for providing a fixing member capable of easily connecting a connector at a substrate and maintaining a connected condition between a substrate and a connector.

SUMMARY OF THE INVENTION

According to an aspect of the present invention, a fixing member includes a case member provided with at least a substrate supporting member adjusted to support a substrate and integrally provided with a connector, a cap member adjusted to be fixed to the case member, at least an external force transmitting portion extending at the substrate supporting member between the substrate supporting member and the cap member and adjusted to transmit an external force subjected to the connector to the cap member while the case member has been fixed at the cap member.

It is preferable that the at least substrate supporting member possesses a predetermined length approximately in a longitudinal direction of the substrate so as to support the substrate.

It is still preferable that a connector terminal of the connector is pressed into the substrate so as to connect the connector with the substrate.

It is still further preferable that the fixing member further includes at least a groove portion defined at the cap member and capable of guiding the substrate such that the substrate is inserted into the cap member 8 approximately in the longitudinal direction of the substrate, and a contact portion to become in contact with an end portion of the inserted substrate.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

Figure 1:
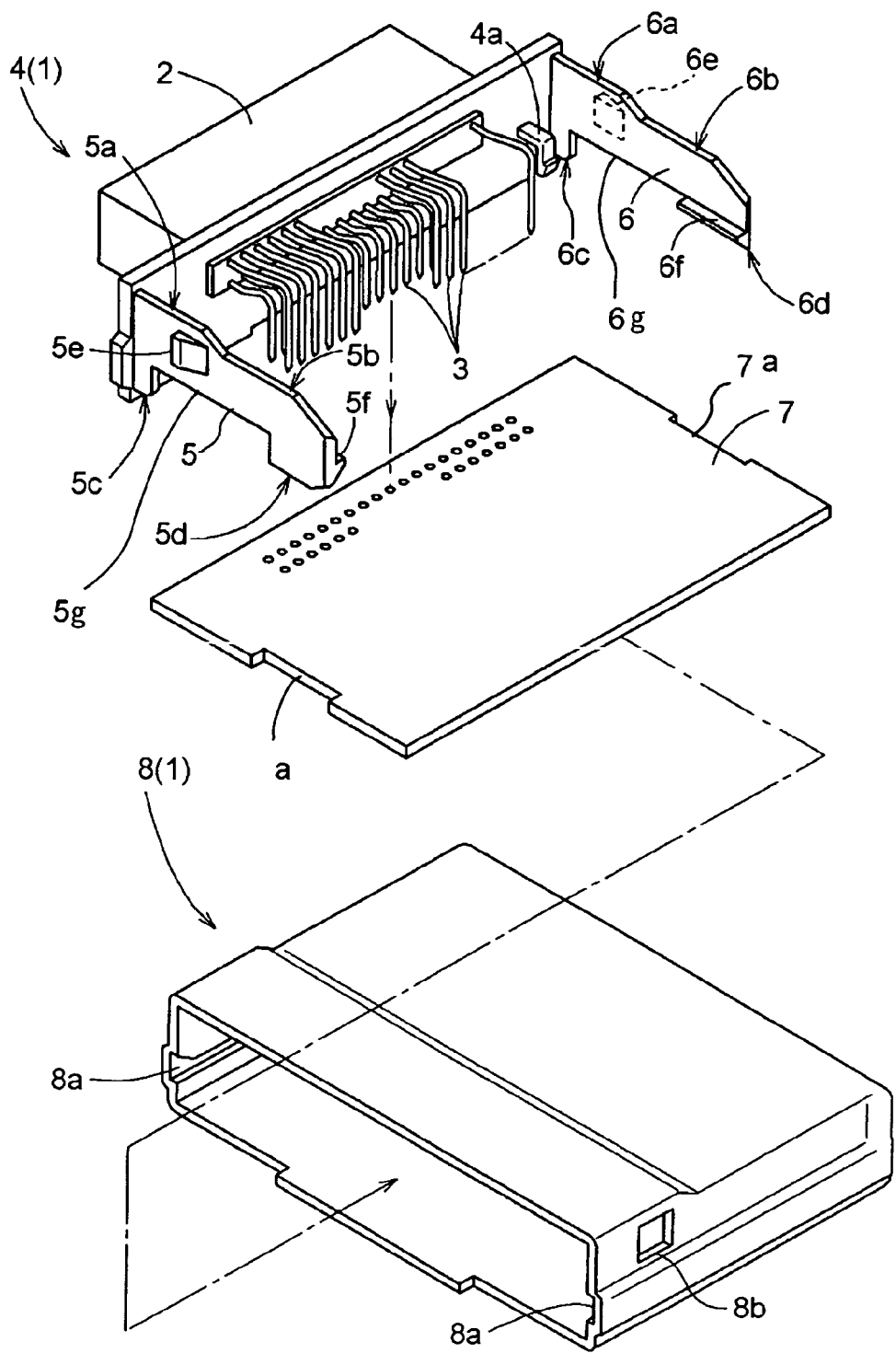
FIG. 1 is a perspective view illustrating a fixing member according to an embodiment of the present invention.

As illustrated in FIG. 1, a fixing member 1 according to an embodiment of the present invention is provided with a case member 4 capable of supporting a substrate 7, a cap member 8 to be fixed with the case member 4. The case member 4 is integrally provided with a connector 2. When an external force is subjected to the connector 2 of the case member 4 already fixed with the cap member 8, the fixing member 1 can transmit the external force to the cap member 8. As the external force subjected to the connector 2, there are an external force applied to the connector 2 in a longitudinal direction of the substrate 7, an external force applied to the connector 2 in a lateral direction of the substrate 7, an external force applied to the connector 2 in order to detach or attach the case member 4 from/at the cap member 8, and so on. The longitudinal direction of the substrate 7 corresponds to a right and left direction in FIG. 2. The lateral direction of the substrate 7 corresponds to an up and down direction in FIG. 2.

As illustrated in FIG. 1, the case member 4 is provided with substrate supporting members 5 and 6 capable of supporting both side portions of the substrate 7 and the connector, all of which configures a C-shaped structure. Each of the substrate supporting members 5 and 6 possesses a predetermined length approximately in a longitudinal direction of the substrate 7 so as to support the substrate 7.

As described above, according to the embodiment of the present invention, the substrate 7 does not have to be fixed with the connector 2 by use of a fixing member such as a screw and so on. Further, compared with a structure for fixing the substrate 7 with the connector 2 by the fixing member, the substrate 7 according to the embodiment of the present invention can be supported in a good manner. Still further, even when the connector 2 is subjected to an external force such as a twisting force, the external force can be preferably transmitted to the cap member 8, thereby enabling to reduce a load to be applied to the connector 2 and the substrate 7.

The case member 4 is further provided with at least one connector terminal 3 for connecting the connector 2 at the substrate 7. According to the embodiment of the present invention, the case member 4 is provided with the plural connector terminals 3. In details, the connector 2 is secured at an approximately intermediate portion of a surface of the case member 4, which exposes outside while the case member 4 has fixed with the cap member 8. Equipped are the connector terminals 3 at a surface of the case member 4 opposite to the surface at which the connector 2 is secured with the case member 4. The connector terminals 3 are pressed into the substrate 7 so as to connect the connector 2 to the substrate 7.

As described above, according to the embodiment of the present invention, the connector can be fixed with the substrate 7 with no use of a solder. Therefore, there is no need to worry about a heat transmission to the case member 4 and the substrate 7, which may be caused upon soldering the connector 2 at the substrate 7. This hence enables to prevent the case member 4 and the substrate 7 from being damaged. Further, when a connector is generally soldered at a substrate, the hours for assembling the fixing member 1 is increased in response to the increase of the number of connector terminals. Therefore, according to the embodiment of the present invention, there is no need to worry about the soldering hours, such that the connector 2 and the substrate 7 can be easily connected.

Further, as illustrated in FIG. 1, the substrate supporting members 5 and 6 are a pair of arms adjusted to support the both side portions of the substrate 7 and are attached at both sides of the surface of the case member 4, at which the connector terminals 3 has been equipped. Each of the substrate supporting members 5 and 6 is designed to posses a sufficient length for supporting the substrate 7.

As described above, according to the embodiment of the present invention, fixing components for fixing the substrate 7 at the case member 4, for example a solder, a screw and so on, are not required. Therefore, the total number of components for the fixing member 1 can be decreased, and hours for assembling the fixing member 1 can be effectively shortened. Further, according to the embodiment of the present invention, the connector 2 is integrally provided at the case member 4. Therefore, the connector 2 can be fixed at the substrate 2 with a high reliability, thereby enabling to increase a durability of the fixing member 1 or the connector 2 against the external force and to reduce a load to be applied to the substrate 7.

Each of the substrate supporting members 5 and 6 has at least one external force transmitting portion. The external force transmitting portion is adjusted to transmit the external force subjected to the connector 2 to the cap member 8 while the external force transmitting portion is in contact with an inside of the cap member 8. For example, when a force is applied to the connector 2 in the lateral and longitudinal directions of the substrate 7, the force is transmitted to the cap member 8. Therefore, even when the external force is subjected to the connector 2, the substrate 7 can be effectively prevented from being subjected to the external force. The connector 2 and the substrate 7 hence can be prevented from being damaged. As the external force transmitting portions, there are external force transmitting portions 5a and 5c (i.e., first substrate supporting portions) defined at the substrate supporting member 5 in the vicinity of an opening of the cap member 8, external force transmitting portions 5b and 5d (i.e., second substrate supporting portions) defined in the vicinity of a tip end of the substrate supporting member 5. Further, there are external force transmitting portions 6a and 6c (i.e., the first substrate supporting portions) defined at the substrate supporting member 6 in the vicinity of the opening of the cap member 8, external force transmitting portions 6b and 6d (i.e., the second substrate supporting portions) defined in the vicinity of a tip end of the substrate supporting member 6. The external force transmitting portions 6a, 6b, 6c and 6d are arranged to be opposed to the external force transmitting portions 5a, 5b, 5c and 5d, respectively.

Figure 2:
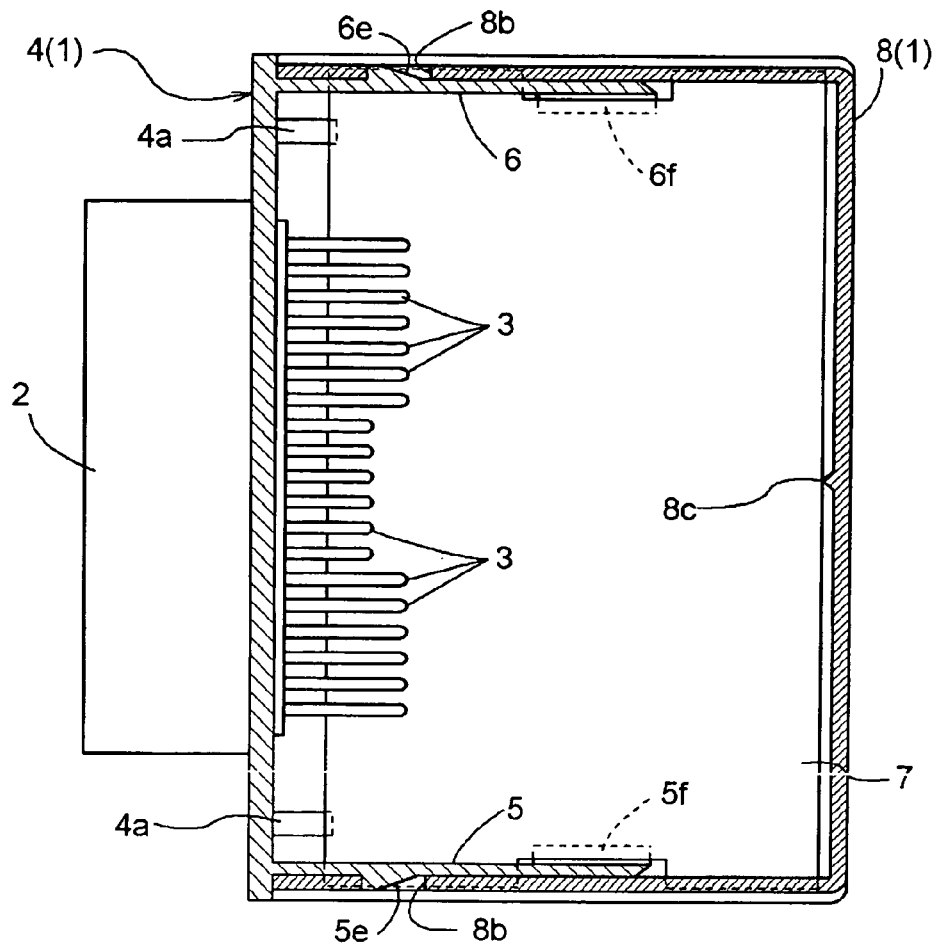
FIG. 2 is a sectional view of the fixing member in a longitudinal direction of the fixing member according to the embodiment of the present invention.
Figure 3:
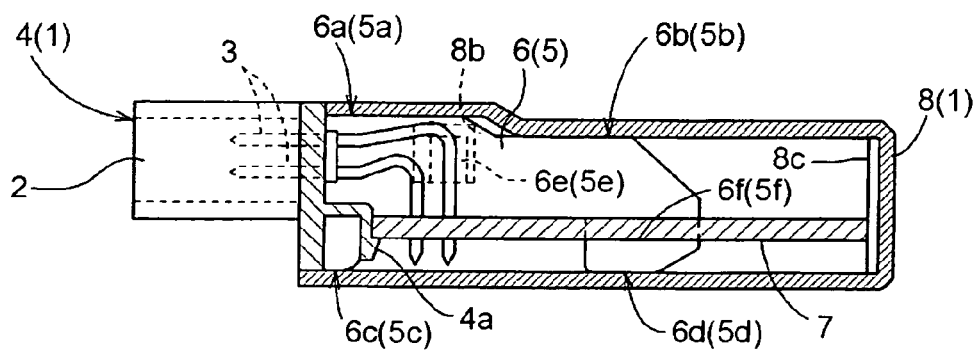
FIG. 3 is a sectional view of the fixing member in a vertical direction of the fixing member according to the embodiment of the present invention.

For example, as illustrated in FIGS. 2 and 3, when the external force is vertically applied to the substrate 7 or is applied at the external force transmitting portions 5a and 6a sides, the external force transmitting portions 5c, 6c, 5b and 6b become in contact with the cap member 8, thereby enabling to transmit the external force to the cap member 8. In the same manner, when the external force is applied at the external force transmitting portions 5c and 6c sides, the external force transmitting portions 5a, 6a, 5d and 6d become in contact with the cap member 8, thereby enabling to transmit the external force to the cap member 8. Further, as illustrated in FIGS. 1, 2, and 3, when the external force is laterally applied to the substrate 7 or is applied at the external force transmitting portions 5a and 5c sides, the external force transmitting portions 5a, 5c, 6b and 6d become in contact with the cap member 8, thereby enabling to transmit the external force to the cap member 8. In the same manner, when the external force is subjected to the external force transmitting portions 6a and 6c, the external force transmitting portions 6a, 6c, 5b and 5d become in contact with the cap member 8, thereby enabling to transmit the external force to the cap member 8.

As illustrated in FIG. 1, a substrate supporting portion 5f is provided at the external force transmitting portion 5d of the substrate supporting member 5. The substrate supporting portion 5f is a flanged portion extending inward of the fixing member 1. There is a notched portion 5g defined between the external force transmitting portions 5c and 5d. In the same manner, a substrate supporting portion 6f is provided at the external force transmitting portion 6d of the substrate supporting member 6. The substrate supporting portion 6f is a flanged portion extending inward of the fixing member 1.

There is a notched portion 6g defined between the external force transmitting portions 6c and 6d.

There is a pair of notched portions 7a defined at the both side portions of the substrate 7, corresponding to the notched portions 5g and 6g. Therefore, according to the embodiment of the present invention, the substrate 7 can be effectively supported by positioning the notched portions 7a of the substrate 7 at the substrate supporting portions 5f and 6f.

There are claws 5e and 6e provided at the substrate supporting members 5 and 6, respectively. The claws 5e and 6e project outward of the case member 4 and can be retracted inwardly. The claws 5e and 6e are engaged to holes 8b (described later) of the cap member 8 so as to support the case member 4.

There are supporting members 4a (i.e., biasing means) at the surface of the base member 4, at which the connector terminals 3 are equipped. The supporting members 4a elastically bias the substrate 7 towards a bottom of the cap member 8, thereby enabling to prevent the substrate 7 from dropping out. As illustrated in FIG. 3, ends of the supporting members 4a are curved towards the bottom of the cap member 8, thereby enabling to stabilize the position of the substrate 7. According to the embodiment of the present invention, the supporting member 4a (i.e., the biasing means) can be a tip portion capable of applying a force to the substrate 7 or a flexible member such as a spring capable of applying a force to the substrate 7, as non-limiting examples.

Figure 4:
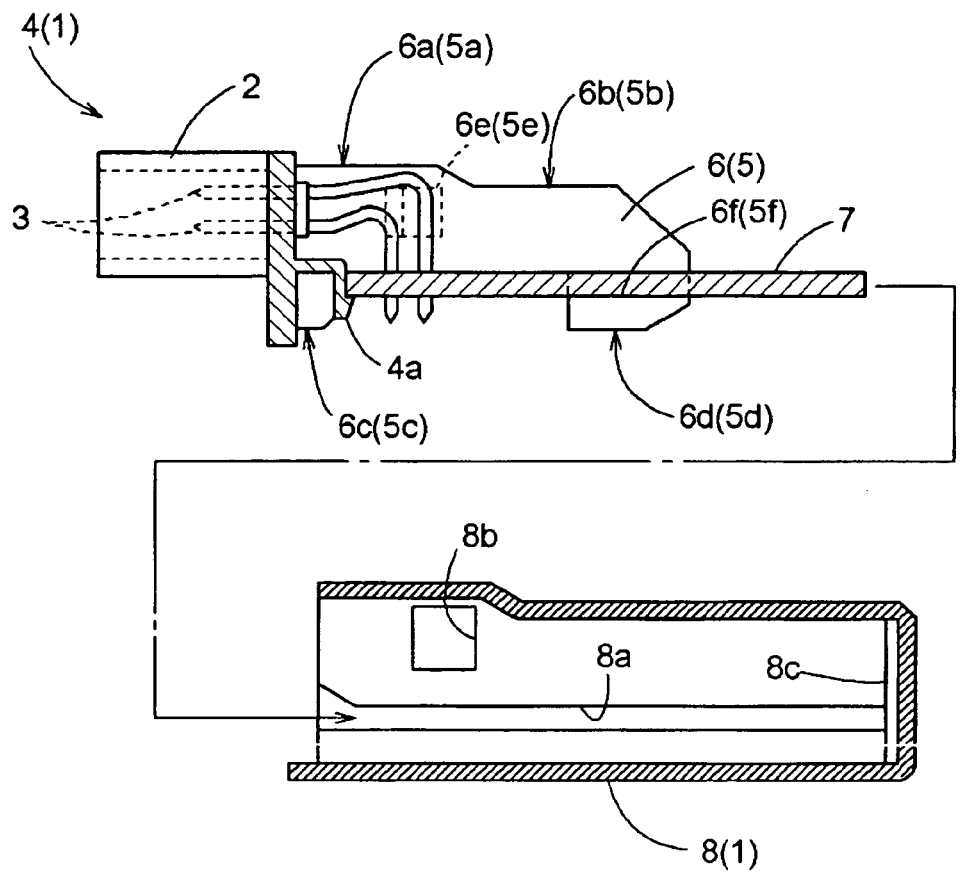
FIG. 4 is an exploded view illustrating the fixing member according to the embodiment of the present invention.
Figure 5:
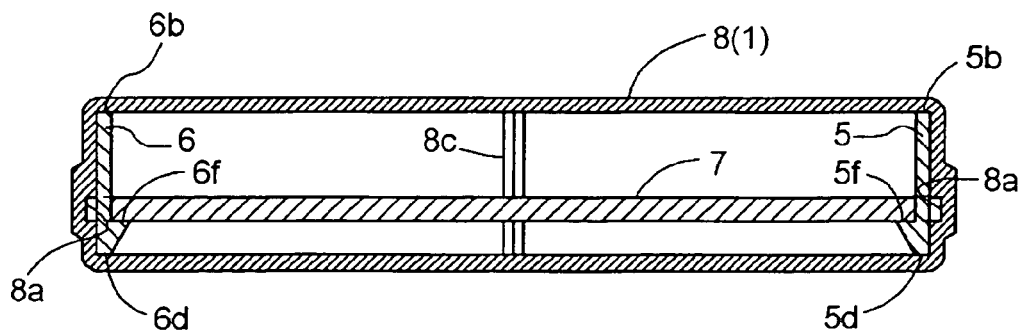
FIG. 5 is a view for explaining a fixed condition of a substrate at a cap member according to the embodiment of the present invention.

As illustrated in FIGS. 4 and 5, the cap member 8 is provided with groove portions 8a and a contact portion 8c at an inner side thereof. The groove portions 8a can guide the both side portions of the substrate 7 fixed at the case member 4 along the longitudinal direction of the substrate 7. The contact portion 8c can become in contact with an end portion of the substrate 7 inserted into the cap member 8 via the groove portions 8a.

The groove portions 8a are defined at portions of which height is approximately the same as a height of the side portion of the substrate 7 being fixed with the cap member 8. Therefore, the substrate 7 can be inserted into the cap member 8 while the both side portions of the substrate 7 have been engaged with the groove portions 8a. Further, the case member 4 can be fixed with the cap member 8 without unnecessary external force applied to the substrate 7. Still further, electronic components on the substrate 7 can be prevented from an impact by inserting the substrate 7 into the groove portions 8a.

As illustrated in FIGS. 1, 2, 3 and 4, the holes 8b are defined at the side surfaces of the cap member 8. Flexure of the case member 4 or of the substrate supporting members 5 and 6 is employed so as not to easily establish or interrupt the attached condition between the bores 8b and the claws 5e and 6e. The holes 8b can support the case member 4 while being engaged with the claws 5e and 6e. When the external force is applied to the case member 4 in the direction for establishing or interrupting the attached condition between the case member 4 and the cap member 8, the external force is transmitted to the cap member 8 via the claws 5e, 6e and the bores 8b.

The contact portion 8c is provided at an intermediate portion of the bottom of the cap member 8 along the lateral direction of the substrate 7. When the contact portion 8c becomes in contact with the end portion of the substrate 7, the contact portion 8c absorbs loose between the claw 5e and the bore 8b or between the claw 6e and the bore 8b. More specifically, when the base member 4 is fixed with the cap member 8, the claw 5e is engaged with the bore 8b. In this case, at least one of the claws 5e and 6e may displace by a dimensional tolerance in the direction for attaching the substrate 7 at the cap member 8. In light of foregoing, when the case member 4 is inserted into the cap member 8, the claws 5e and 6e are engaged with the bores 8b after the contact of the end portion of the substrate 7 at the contact portion 8c, i.e., after a certain deformation of the contact portion 8. Therefore, the contact portion 8c can effectively absorb the displacement between the bores 8b and at least one of the claws 5e and 6e, thereby enabling to stabilize the substrate 7 along the direction for establishing or interrupting the attached condition between the case member 4 and the cap member 8.

Further, according to the embodiment of the present invention, while the case member 4 has been engaged with the cap member 8, the substrate 7 can be employed as a bridge. Therefore, the substrate 7 can effectively prevent the substrate supporting members 5 and 6 from deformation, thereby enabling to stabilize the engaged condition between the case member 4 and the cap member 8.

The principles, embodiment and modes of operation of the present invention have been described in the foregoing specification and drawings. However, the invention which is intended to be protected is not to be construed as limited to the particular embodiments disclosed. Further, the embodiments described herein are to be regarded as illustrative rather than restrictive. Plural objectives are achieved by the present invention, and yet there is usefulness in the present invention as far as one of the objectives are achieved. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A fixing member comprising:
  a box-shaped cap member having an opening at one end thereof, and
  a case member fixed to the cap member to cover the opening of the cap member, said case member including a connector, a connector terminal for connecting the connector to a substrate having a surface and a back face opposite to the surface, and a substrate supporting member formed integrally with the connector in one piece, the substrate supporting member including a flange portion contacted with the back face of the substrate to support the substrate,
  wherein the substrate supporting member further includes an external force transmitting portion contacted with an inside face of the cap member so as to transmit an external force subjected to the connector to the cap member without transmitting the external force through the substrate.

2. A fixing member according to claim 1, wherein at least the substrate supporting member possesses a predetermined length approximately in a longitudinal direction of the substrate so as to support the substrate.

3. A fixing member according to claim 2, wherein at least the substrate supporting member includes a pair of substrate supporting members, each of which possesses the predetermined length approximately in the longitudinal direction of the substrate so as to support both sides of the substrate.

4. A fixing member according to claim 2, further comprising:
  at least a substrate supporting portion provided at the substrate supporting member and adjusted to be fixed at the substrate.

5. A fixing member according to claim 2, further comprising:
   at least a notched portion defined at the substrate and fixed with the at least substrate supporting member.

6. A fixing member according to claim 4, further comprising:
   at least a notched portion defined at the both sides of the substrate and fixed with the at least substrate supporting portion provided at the at least substrate supporting member.

7. A fixing member according to claim 1, wherein the at least external force transmitting member includes at least a first substrate supporting portion adjusted to support the substrate at an opening portion of the cap member and at least a second substrate supporting portion adjusted to support the substrate at an intermediate portion of the cap member.

8. A fixing member according to claim 7, further comprising:
   at least a notched portion defined between the first substrate supporting portion and the second substrate supporting portion and supporting the substrate.

9. A fixing member according to claim 1, further comprising:
   biasing means for biasing the substrate supported by the case member towards the cap member.

10. A fixing member according to claim 1, wherein a connector terminal of the connector is pressed into the substrate so as to connect the connector with the substrate.

11. A fixing member according to claim 1, further comprising:
   at least a groove portion defined at the cap member and capable of guiding the substrate such that the substrate is inserted into the cap member 8 approximately in the longitudinal direction of the substrate; and
   a contact portion to become in contact with an end portion of the inserted substrate.

12. A fixing member according to claim 11, wherein the substrate inserted into the cap member acts as a bridge of the cap member.

13. A fixing member according to claim 1, further comprising:
   at least a claw provided at the at least substrate supporting member so as to support the fixed condition between the case member and the cap member.

14. A fixing member according to claim 1, wherein the substrate supporting member has a predetermined length which is more than a half length of the substrate in an extending direction of the substrate.

15. A fixing member according to claim 1, wherein the case member further includes a cover portion covering the opening of the cap member, the connector extending from the cover portion in a first direction and disposed outside the cap member and the substrate supporting member extending from the cover portion in a second direction opposite to the first direction.

16. A fixing member according to claim 1, wherein the substrate supporting member is different from the connector terminal.

* * * * *